(12) United States Patent
Li et al.

(10) Patent No.: US 12,726,158 B2
(45) Date of Patent: Sep. 1, 2026

(54) INPUT BUFFER AND METHOD FOR OPERATING THE SAME

(71) Applicant: MACRONIX INTERNATIONAL CO., LTD., Hsinchu (TW)

(72) Inventors: Tung-Yu Li, Taoyuan City (TW); Shang-Chi Yang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 40 days.

(21) Appl. No.: 18/777,683

(22) Filed: Jul. 19, 2024

(65) Prior Publication Data

US 2026/0025110 A1 Jan. 22, 2026

(51) Int. Cl.
*H03K 17/56* (2006.01)
*H03F 3/04* (2006.01)

(52) U.S. Cl.
CPC ............... *H03F 3/04* (2013.01); *H03K 17/56* (2013.01)

(58) Field of Classification Search
CPC .................................. H03F 3/04; H03K 17/56
See application file for complete search history.

(56) References Cited

U.S. PATENT DOCUMENTS 4,656,374 A * 4/1987 Rapp ................ H03K 3/356113 323/317
6,459,556 B1 10/2002 Taguchi
2019/0140652 A1* 5/2019 Tsai ..................... H03K 3/0315

FOREIGN PATENT DOCUMENTS

JP 2008129717 A * 6/2008

* cited by examiner

*Primary Examiner* — Daniel C Puentes
(74) *Attorney, Agent, or Firm* — McClure, Qualey & Rodack, LLP

(57) ABSTRACT

An input buffer is provided and includes a current mirror circuit and a first amplifier. The current mirror includes first to second transistors. The first transistor is configured to couple a current source at a first node. The second transistor is coupled with the first transistor and is configured to output, according to a first current flowing through the first transistor, a second current at a second node. The first amplifier is coupled with the current mirror circuit at the second node, and includes a first transistor pair. A first breakdown voltage of the first transistor pair is smaller than a second breakdown voltage of the second transistor. The first transistor pair is configured to generate, in response to the second current and first to second input voltages, first to second voltages.

14 Claims, 4 Drawing Sheets

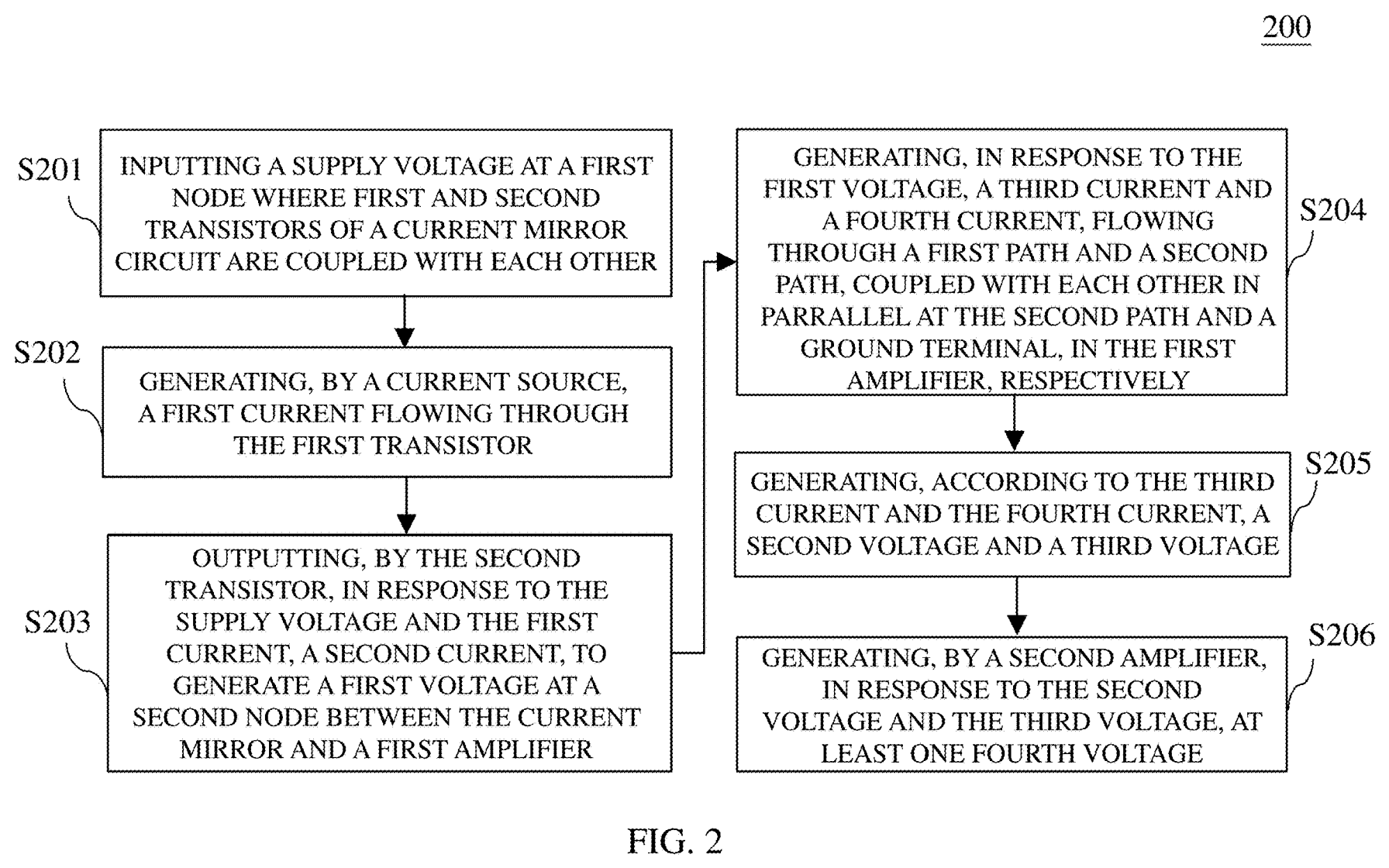

200

S201 INPUTTING A SUPPLY VOLTAGE AT A FIRST NODE WHERE FIRST AND SECOND TRANSISTORS OF A CURRENT MIRROR CIRCUIT ARE COUPLED WITH EACH OTHER

S202 GENERATING, BY A CURRENT SOURCE, A FIRST CURRENT FLOWING THROUGH THE FIRST TRANSISTOR

S203 OUTPUTTING, BY THE SECOND TRANSISTOR, IN RESPONSE TO THE SUPPLY VOLTAGE AND THE FIRST CURRENT, A SECOND CURRENT, TO GENERATE A FIRST VOLTAGE AT A SECOND NODE BETWEEN THE CURRENT MIRROR AND A FIRST AMPLIFIER

S204 GENERATING, IN RESPONSE TO THE FIRST VOLTAGE, A THIRD CURRENT AND A FOURTH CURRENT, FLOWING THROUGH A FIRST PATH AND A SECOND PATH, COUPLED WITH EACH OTHER IN PARRALLEL AT THE SECOND PATH AND A GROUND TERMINAL, IN THE FIRST AMPLIFIER, RESPECTIVELY

S205 GENERATING, ACCORDING TO THE THIRD CURRENT AND THE FOURTH CURRENT, A SECOND VOLTAGE AND A THIRD VOLTAGE

S206 GENERATING, BY A SECOND AMPLIFIER, IN RESPONSE TO THE SECOND VOLTAGE AND THE THIRD VOLTAGE, AT LEAST ONE FOURTH VOLTAGE

FIG. 2

INPUT BUFFER AND METHOD FOR OPERATING THE SAME

BACKGROUND

Field of Invention

The present invention relates to an input buffer and a method for operating the same. More particularly, the present invention relates to an input buffer capable of overcoming headroom and breakdown voltage issues and a method for operating the same.

Description of Related Art

In the field of wireless transmission technology, input buffers are utilized to amplify the received signals to offset the channel loss in the process of transmitting the signals from the transmitter to the receiver. However, two key issues—headroom and breakdown voltage must be overcome in input buffers made of transistors. Therefore, it is an indispensable step for improving the quality of wireless transmission to develop a input buffer with enough headroom to ensure that the transistors are operationally in the saturation region and under the breakdown voltage.

SUMMARY

The invention provides an input buffer that includes a current mirror circuit and a first amplifier. The current mirror includes first to second transistors. The first transistor is configured to be coupled with a current source at a first node. The second transistor is coupled with the first transistor and configured to output, according to a first current flowing through the first transistor, a second current at a second node. The first amplifier is coupled with the current mirror circuit at the second node, and includes a first transistor pair. A first breakdown voltage of the first transistor pair is smaller than a second breakdown voltage of the second transistor. The first transistor pair is configured to generate, in response to the second current and first to second input voltages, first to second voltages.

In some embodiments, each transistor of the first transistor pair and the first to second transistors are P-type transistors.

In some embodiments, the first to second transistors are P-type transistors, and each transistor of the first transistor pair is an N-type transistor.

In some embodiments, a first terminal and a control terminal of the first transistor are coupled with each other at the first terminal.

In some embodiments, a control terminal of the first transistor and a control terminal of the second transistor are coupled with each other at the first terminal.

In some embodiments, a third breakdown voltage of the first transistor is larger than the first breakdown voltage.

In some embodiments, the first transistor pair includes a third transistor and a fourth transistor coupled with each other in parallel between the second node and a ground terminal.

In some embodiments, the first amplifier further includes a first resistor coupled with the third transistor in series, and a second resistor coupled with the fourth transistor in series.

In some embodiments, the first resistor and the second resistor have a same resistance value.

In some embodiments, the second input voltage oscillates with respect to a central value and the first input voltage is equal to the central value.

In some embodiments, body terminals of each transistor of the transistor pair are coupled to the second node.

In some embodiments, the input buffer further includes a second amplifier. The second amplifier includes a second transistor pair having control terminals coupled with the first amplifier. The second amplifier is configured to generate, in response to the first voltage and the second voltage, an output voltage.

The invention provides a method for operating an input buffer that includes: inputting a supply voltage at a first voltage where first to second transistors of a current mirror circuit are coupled with each other; generating, by a current source, a first current flowing through the first transistor; outputting, by the second transistor, in response to the supply voltage and the first current, a second current, to generate a first voltage at a second node between the current mirror circuit and a first amplifier; generating a third current and a fourth current, flowing through a first path and a second path in the first amplifier, coupled with each other in parallel at the second node and a ground terminal, respectively; and generating, according to the third current and the fourth current, a second voltage and a third voltage.

In some embodiments, the supply voltage is 2.2 to 2.5 volts.

In some embodiments, the method further includes generating, by a second amplifier, in response to the second voltage and the third voltage, at least one fourth voltage.

The invention provides an input buffer that includes multiple high voltage components and a first amplifier. First terminals of the multiple high voltage components are configured to receive a first supply voltage at a first node. A second terminal of a first high voltage is configured to be coupled with a current source. The first amplifier includes first to second transistors. The control terminals of the first and second transistors receive a reference voltage and an input signal, respectively. The first transistor and the second transistor are coupled with a second high voltage component of the multiple high voltage components. A first breakdown voltage of a first transistor and a second breakdown voltage of the second transistor are smaller than breakdown voltages of the multiple high voltage components. The first amplifier is configured to generate, in response to the input signal, a first signal and a second signal, at a first terminal of the first transistor and a first terminal of the second transistor, respectively.

In some embodiments, control terminals of the multiple high voltage components are coupled with each other, and configured to receive a bias voltage.

In some embodiments, the first supply voltage is 2.2 to 2.5 volts and the bias voltage is 0.7 to 1 volt.

In some embodiments, the input buffer further includes a second amplifier. The second amplifier is coupled with a third high voltage of the multiple high voltage components, and includes third to fourth transistors. Control terminal of the third and fourth transistors are coupled with the first terminals of the first and second transistors, respectively. The second amplifier is configured to generate, in response to the first signal and the second signal, third and fourth signals, at first terminals of the third and fourth transistor, respectively.

In some embodiments, the input buffer further includes a third amplifier. The third amplifier includes fifth to sixth transistors. Control terminals of the fifth and sixth transistors are coupled with the first terminals of the third and fourth transistors. The third amplifier is configured to generate, in response to the third signal and the fourth signal, an output signal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

FIG. 2 illustrates a method for operating an input buffer, in accordance with various embodiments of the present disclosure.

DETAILED DESCRIPTION

Figure 1:
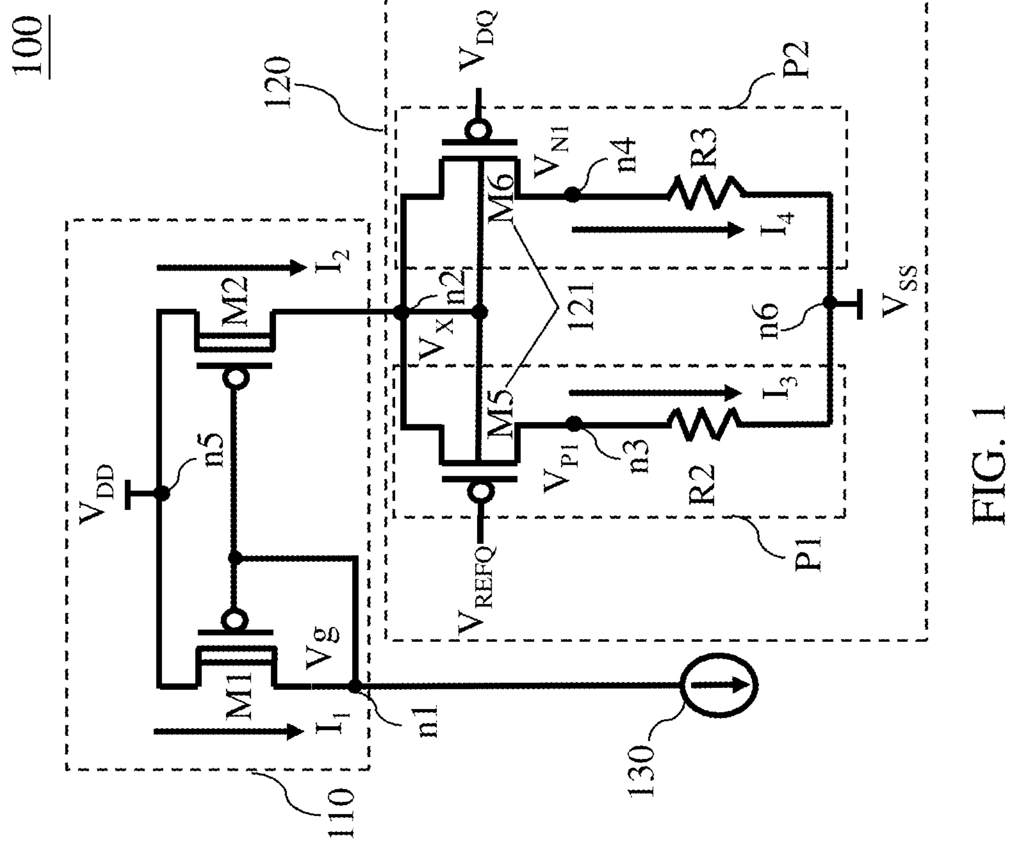
FIG. 1 illustrates a circuit diagram of an input buffer, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 illustrates a circuit diagram of an input buffer 100, in accordance with some embodiments of the present disclosure. As shown in FIG. 1, the input buffer 100 includes a current mirror circuit 110 and an amplifier 120. The current mirror circuit 110 is coupled with a current source 130 and the amplifier 120 at a node n1 and a node n2, respectively. Therefore, the current mirror circuit 110 is configured to map a current $I_1$ supplied by the current source 130 onto a current $I_2$ flowing into the amplifier 120.

Specifically, the current mirror circuit 110 includes a transistor M1 and a transistor M2. The transistor M1 is configured to be coupled with the current source 130 at the node n1 so as to be able to generate the current $I_1$ flowing through the transistor M1 by the current source 130. The transistor M2 is coupled with the transistor M1 and the amplifier 120, in which the transistor M2 is coupled with the amplifier 120 at the node n2. Therefore, the transistor M2 can output the current $I_2$ at the node n2 according to the current $I_1$, i.e., the current $I_1$ is mapped into the current $I_2$ and transmitted to the amplifier 120.

As shown in FIG. 1, a gate terminal of the transistor M1 and a gate terminal of the transistor M1 are coupled with each other at the node n1. The gate terminal and a drain terminal of the transistor M1 are further coupled with each other at the node n1. A source terminal of the transistor M1 and a source terminal of the transistor M2 are coupled with each other at a node n5 and receive a supply voltage $V_{DD}$.

Specifically, the amplifier 120 includes a transistor pair 121. The transistor pair 121 includes a transistor M5 and a transistor M6. The transistor M5 and the transistor M6 are coupled in parallel with each other between the node n2 and a ground terminal n6. In some embodiments, a body terminal of the transistor M5 and a body terminal of the transistor M6 are coupled to the node n2. As shown in FIG. 1, the ground terminal n6 is coupled to a supply voltage $V_{SS}$. In some embodiments, the supply voltage $V_{SS}$ has a ground voltage. In some embodiments, the transistors M5 and M6 of the transistor pair 121 are the same or nearly the same.

In some embodiments, the transistor pair 121 can be implemented by low voltage (LV) transistors of low breakdown voltage while the transistor M1 and the transistor M2 can be implemented by high voltage (HV) transistors. For example, a breakdown voltage $V_{brMM}$ of each transistor M5 or M6 of the transistor pair 121 is smaller than a breakdown voltage $V_{brM1}$ of the transistor M1 and a breakdown voltage $V_{brM2}$ of the transistor M2. In some embodiments, the breakdown voltage $V_{brM1}$ is equal to the breakdown voltage $V_{brM2}$ of the transistor M2.

By coupling HV transistors with LV transistors, it can be ensured that drain-source voltages of the HV transistors and drain-source voltages of the LV transistors are operationally in the region of enough headroom (i.e., the saturation region) and under the breakdown voltage, respectively. In this way, the current mirror circuit 110 can map the current $I_1$ precisely, and each of transistors M5 and M6 of the transistor pair 121 in the amplifier 120 is not broken down. Specific operation will be detailed in later paragraphs.

In some embodiments, the breakdown voltage $V_{brM2}$ is more than 2.3 volt larger than the breakdown voltage $V_{brMM}$. In some embodiments, the breakdown voltage $V_{brM2}$ is around 3 to 4 volt and the breakdown voltage $V_{brMM}$ is around 1.3 to 1.5 volt.

Furthermore, a gate terminal of the transistor M5 and a gate terminal of the transistor M6 are configured to receive an input signal (input voltage) $V_{REFQ}$ and an input signal (input voltage) $V_{DQ}$. Therefore, the transistor pair 121 can generate a signal (voltage) $V_{P1}$ and a signal (voltage) $V_{N1}$ at a node n3 and a node n4, respectively, according to the current $I_2$ mapped by the current mirror circuit 110 and flowing into the node n2, the input signal $V_{DQ}$, and the input signal $V_{REFQ}$.

In some embodiments, the input voltage $V_{REFQ}$ serves as a reference voltage for the input voltage $V_{DQ}$. For example, the input voltage $V_{DQ}$ oscillates with constant amplitude $V_Y$ relative to the reference voltage $V_{REFQ}$. Alternatively stated, the reference voltage $V_{REFQ}$ is a central value of the input voltage $V_{DQ}$.

Specifically, the input voltage $V_{REFQ}$ can be transmitted from the transmitter and the reference voltage $V_{REFQ}$ can be a predetermined bias for operating the input buffer 100. In some embodiments, the reference voltage $V_{REFQ}$ is 0.6 volt, the amplitude $V_Y$ is 500 millivolts, and the input voltage $V_{DQ}$ is 0.6 volt±500 millivolts. In some embodiments, the reference voltage $V_{REFQ}$ is 0.2 volt, the amplitude $V_Y$ is (80-100) millivolts, and the input voltage $V_{DQ}$ is 0.6 volt± (80-100) millivolts.

In some approaches, the voltage $V_X$ at the node n2 varies with the oscillation of the input voltage $V_{DQ}$, so as to compress the headroom of the transistor M2 (i.e., when the input voltage $V_{DQ}$ is pulled up, the drain-source voltage of the transistor M2 drops).

However, by implementing the input buffer 100 of the present disclosure, the current $I_2$ can be controlled by altering the current $I_1$, to determine the voltage $V_{P1}$ at the node n3 and the voltage $V_{N1}$ at the node n4 in order to operating the transistor M6 in a safe range while receiving the input voltage $V_{DQ}$. Alternatively stated, the drain-source voltage ($V_{DS}$) is smaller than the breakdown voltage $V_{brMM}$.

Specifically, as shown in the embodiments of FIG. 1, the transistors M5 and M6 are coupled in series to resistors R2 and R3 at nodes n3 and n4 respectively, in which the resistors R2 and R3 have a same resistance value $R_{val}$. Continued the aforementioned embodiments, a common mode $V_{COM}$ of the voltage $V_{P1}$ and the voltage $V_{N1}$ can be expressed by equation (1) below:

$$V_{COM} = R_{val} \times \frac{I_2}{2} \tag{1}$$

In some embodiments, when the input voltage $V_{DQ}$ has a maximum value (i.e., equal to ($V_{REFQ}$+$V_Y$)), the voltage $V_X$ increases and the voltage $V_{N1}$ decreases, which induces the drain-source voltage of the transistor M6 rises. By setting the current $I_2$ according to equation (1) to control the voltage $V_{N1}$ not drop significantly low, the drain-source voltage of the transistor M6 is kept smaller than the breakdown voltage $V_{brMM}$. On the other hand, corresponding to the increasing voltage $V_X$, through implementing the transistor M2 having the high breakdown voltage $V_{brM2}$, the supply voltage can increase to enlarge the voltage headroom of the transistor M2.

For example, in some approaches, the LV transistors are utilized to serve as the components of the current mirror that are configured to receive the supply voltage. It turns out that the supply voltage is roughly defined within the range of 0.9-1.2 volts due to the limit of the breakdown voltage of the LV transistors. On the contrary, in some embodiments of the present disclosure, the HV transistors M1 and M2 are utilized in the current mirror circuit 110, so that the higher supply voltage, e.g., 2.2-2.5 volts, can be applied.

It should be understood that P-type transistors are merely taken as an example of the transistors M1, M2, M5, and M6 depicted in FIG. 1. This does not limit the present disclosure. In another embodiment, compared with the embodiments of FIG. 1, the transistors M1, M2, M5, and M6 are N-type transistors. Specifically, the source terminals of the transistors M5 and M6 are coupled to the supply voltage $V_{SS}$, the drain terminal of the transistor M5 is coupled to the node n5 through the resistor R2, and the drain terminal of the transistor M6 is coupled to the node n5 through the resistor R3. The configurations of the aforementioned embodiments are similar to those in the embodiments of FIG. 1, and the repetitious descriptions are omitted here.

Reference is now made to FIG. 2. FIG. 2 illustrates a method 200 for operating an input buffer, in accordance with various embodiments of the present disclosure. It should be understood that additional operations can be provided before, during, and after the processes as shown in FIG. 2, and some operations described below can be replaced or eliminated for additional embodiments of the method 200. The method 200 for operating an input buffer includes steps S201-S206 described by making reference to FIG. 2 and following FIGS. 3-4.

In step S201, as shown in FIG. 1, the supply voltage $V_{DD}$ is inputted at the node n5 where the transistor M1 and the transistor M2 are coupled with each other.

In step S202, the current source 130 generates the current $I_1$ flowing through the transistor M1.

In step S203, the transistor M2 outputs the second current $I_2$, in response to the supply voltage $V_{DD}$ and the current $I_1$, to generate the voltage $V_X$ at the node n2 between the current mirror circuit 110 and the amplifier 120.

In some embodiments, the proportion of the current $I_1$ to the current $I_2$ can be adjusted by the sizes of the transistors M1 and M2. For example, when the sizes of the transistors M1 and M2 are the same, the proportion of the current $I_1$ to the current $I_2$ is 1:1, e.g., both them are 1 milliampere. By adjusting the sizes of the transistors M1 and M2, the proportion of the current $I_1$ to the current $I_2$ can be changed to 1:2, e.g., the current $I_1$ is 1 milliampere, and the current $I_2$ is 2 milliampere.

Reference continues to be made to FIG. 2. In step S204, the current $I_3$ and the current $I_4$, flowing through the path P1 and the path P2, coupled with each other in parallel at the second node n2 and a ground terminal n6, in the amplifier 120 are generated in response to the voltage $V_X$, respectively. For example, the path P1 is formed by coupling the transistor M5 with the resistor R2 in series, and the path P2 is formed by coupling the transistor M6 with the resistor R3 in series.

In step S205, the voltage $V_{P1}$ and the voltage $V_{N1}$ are generated according to the current $I_3$ and the current $I_4$. In other words, the amplifier 120 can be configured to serve as a branch circuit and divide the current $I_2$ into the current $I_3$ and the current $I_4$, so as to generate the voltage $V_{P1}$ and the voltage $V_{N1}$ according to the current $I_3$ and the current $I_4$.

With the method 200 for operating the input buffer, the headroom ($V_{DD}-V_X$) of the transistor M2 is improved. For example, by applying the supply voltage $V_{DD}$ of 2.2-2.5 volts, the voltage Vg of a little bit higher one volt and the voltage $V_X$ of 1.2-1.7 volts are generated at the node n1 an the node n2, respectively. In this way, the headroom of the transistor M2 is increased to around 0.8 volt.

Figure 3:
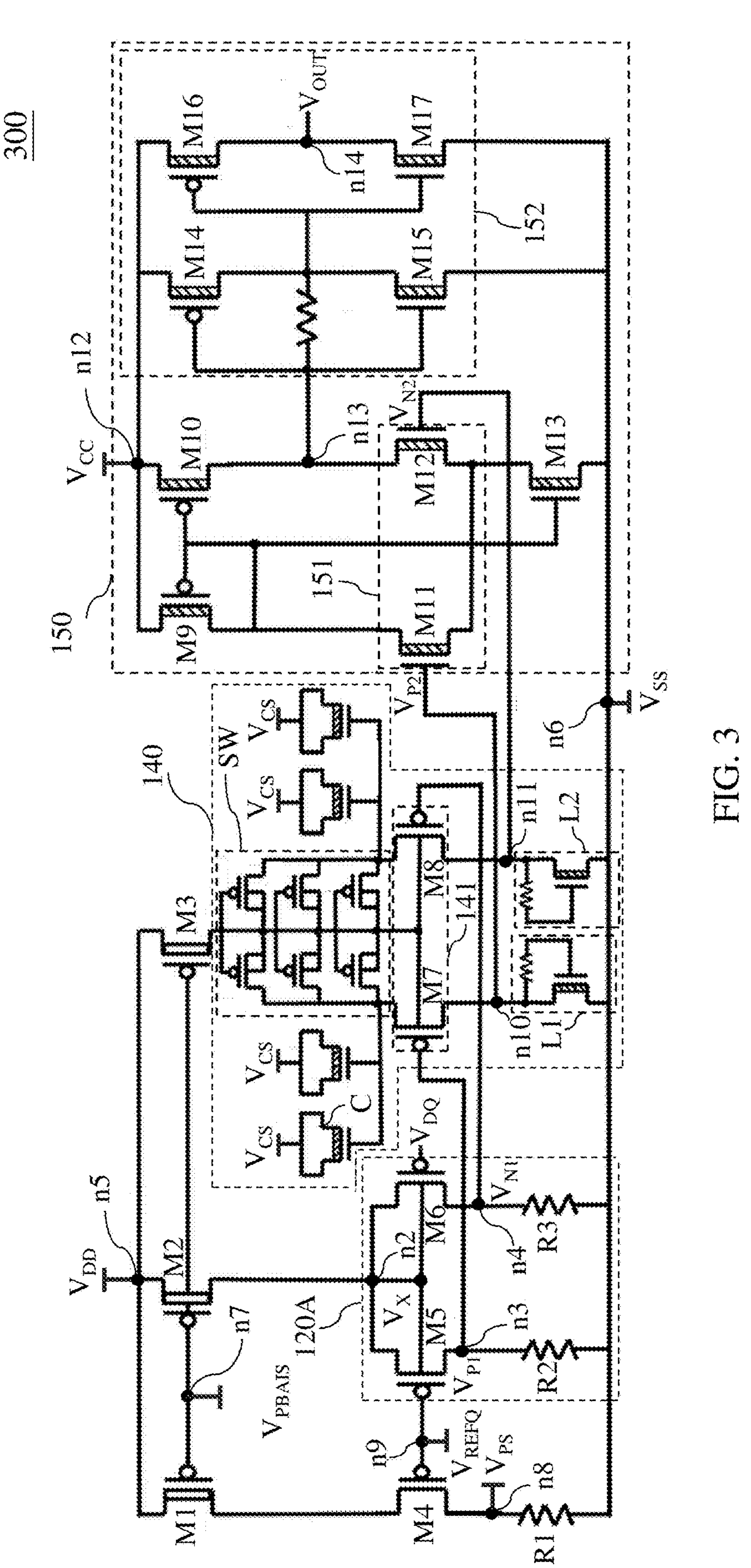
FIG. 3 illustrates a circuit diagram of an input buffer, in accordance with some embodiments of the present disclosure.

Reference is now made to FIG. 3. FIG. 3 illustrates a circuit diagram of an input buffer 300, in accordance with some embodiments of the present disclosure. As shown in FIG. 3, the input buffer 300 includes the transistors M1 and M2, and the amplifier 120A. In addition to the configurations in FIG. 1 and the descriptions associated therewith (for conciseness, repetitious descriptions are omitted here), in some embodiments, the gate terminals of the transistor M1 and the transistor M2 are coupled with each other, and configured to receive a bias voltage $V_{PBAIS}$. In some embodiments, the bias voltage $V_{PBAIS}$ is generated by a current source and is 0.7-1 volt.

Moreover, as shown in FIG. 3, the input buffer 300 further includes a transistor M4 and a resistor R1. The transistor M4 and the resistor R1 are coupled with each other at the node n8, and output a bias voltage $V_{PS}$ at the node n8. In addition, a gate terminal of the transistor M4 is coupled with the gate terminal of the transistor M5 of the amplifier 120A to receive the reference voltage $V_{REFQ}$.

In operation aspect, with the supply voltage $V_{DD}$ and the reference voltage $V_{REFQ}$ keeping constant, the amplifier 120A is configured to generate, in response to the input signal $V_{DQ}$, the signal $V_{P1}$ and the signal $V_{N1}$ at the drain terminal of the transistor M5 and the drain terminal of the transistor M6, respectively, which is similar to the input buffer 100.

In some embodiments, the input buffer 300 can further include a transistor M3 and an amplifier 140. A gate terminal of the transistor M3 is coupled with the gate terminals of the transistors M1 and M2, and configured to receive the bias voltage $V_{PBAIS}$. A source terminal of the transistor M3 is coupled with the source terminals of the transistors M1 and M2, and configured to receive the supply voltage $V_{DD}$. The drain terminal of the transistor M3 is coupled with the amplifier 140. The amplifier 140 includes the transistor M7 and the transistor M8. A gate terminal of the transistor M7 is coupled with the drain terminal of the transistor M5 to receive the signal $V_{P1}$. Similarly, a gate terminal of the transistor M8 is coupled with the drain terminal of the transistor M6 to receive the signal $V_{N1}$.

Therefore, the amplifier 140 can be configured to perform step S206 as shown in FIG. 2. In step S206, the amplifier 140 generates the signal $V_{P2}$ and the signal $V_{N2}$ in response to the signal $V_{P1}$ and the signal $V_{N1}$. Particularly, the amplifier 140 is configured to generate, in response to the signal $V_{P1}$ and the signal $V_{N1}$, the signal $V_{P2}$ and the signal $V_{N2}$ at a drain terminal of the transistor M7 (i.e., a node n10) and a drain terminal of the transistor M8 (i.e., a node n11), respectively.

In some embodiments, the amplifier 140 further includes active inductor circuits L1 and L2. Each active inductor circuit L1 or L2 includes a transistor and a resistor coupled between a gate terminal and a drain terminal of the transistor. In some embodiments, the amplifier 140 further includes a switch SW that includes multiple transistor pairs coupled in parallel with each other between a source terminal of the transistor M7. In some embodiments, the transistor pairs in the switch SW selectively turn on in response to control signals from a multiplexer (not shown). For instance, the transistor pairs are switched to turn on in response to 3-bit control signal, in which at least one transistor pair turns on in a default mode. In some embodiments, the switch SW turns on to output the bias voltage $V_{PS}$. In another embodiments, the switch SW turns off to output the supply voltage $V_{DD}$.

In some embodiments, the amplifier 140 further includes multiples capacitance units C implemented by transistors. Each capacitance unit C is configured to receive a bias voltage $V_{CS}$.

In some embodiments, the input buffer 300 further includes an amplifier 150. The amplifier 150 receives a supply voltage $V_{CC}$, different from the supply voltage $V_{DD}$, at a node 12. In some embodiments, the supply voltage $V_{CC}$ is smaller than the supply voltage $V_{DD}$. In some embodiments, the supply voltage $V_{CC}$ is around 1.2 volts.

Specifically, the amplifier 150 includes a transistor pair 151 having a transistor M11 and a transistor M12. A gate terminal of the transistor M11 is coupled with the drain terminal of the transistor M7 to receive the signal $V_{P2}$. A gate terminal of the transistor M12 is coupled with the drain terminal of the transistor M8 to receive the signal $V_{N2}$. Therefore, the amplifier 150 is configured to generate an output signal $V_{OUT}$ in response to the signal $V_{P2}$ and the signal $V_{N2}$. In some embodiments, the amplifier 150 further includes an output circuit 152 which is configured to output the output signal $V_{OUT}$. The output circuit 152 is coupled with a drain of the transistor M12 at a node n13. The output circuit 152 includes multiple transistors M14-M17. The gate terminals of the multiple transistors M14-M17 are coupled to the node n13. The output signal is outputted at a node n14 between a transistor M16 and a transistor M17.

Figure 4:
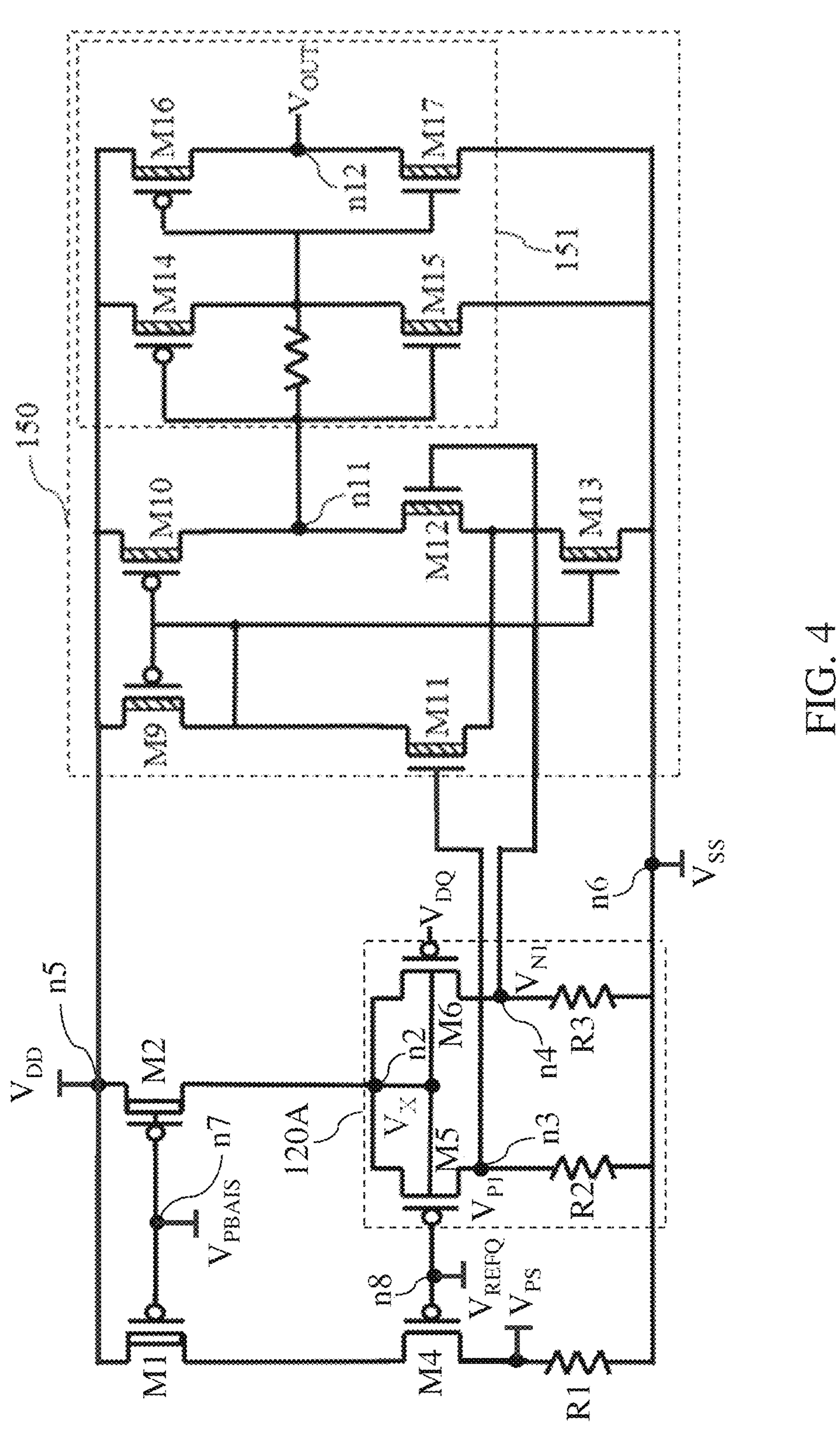
FIG. 4 illustrates a circuit diagram of an input buffer, in accordance with some embodiments of the present disclosure.

Reference is now made to FIG. 4. FIG. 4 illustrates a circuit diagram of an input buffer 400, in accordance with some embodiments of the present disclosure. In comparison with the input buffer 300 in FIG. 3, the amplifier 140 is omitted in the input buffer 400 as shown in FIG. 4 such that the amplifier 150 is directly coupled with the amplifier 120A. Specifically, the gate terminal of the transistor M11 in the amplifier 150 is coupled with the drain terminal M5 of the amplifier 120A to receive the signal $V_{P1}$. The gate terminal of the transistor M12 of the amplifier 150 is coupled with the drain terminal M6 of the amplifier 120A to receive the signal $V_{N1}$.

Therefore, the amplifier 150 can be configured to performed step S206 as shown in FIG. 2. In step S206, the amplifier 150 generates the output signal $V_{OUT}$ in response to the signal $V_{P1}$ and the signal $V_{N1}$.

Furthermore, in the embodiments as shown in FIG. 3 to FIG. 4, the amplifier 120A and the amplifier 140 can be replaced with each other. The amplifier 120A and/or the amplifier 140 can be exchanged with each other. In some embodiments, the amplifier 120A and/or the amplifier 140 can be replaced with any other amplifier having two input terminals and two output terminals. In some embodiments, the amplifier 150 can be replaced with any other amplifier having two input terminals and a signal output terminal.

Furthermore, in all the embodiments mentioned above, the transistors M1-M3 can be replaced with high-voltage components such as double diffusion drain (DDD) components, High-k Metal Gate (HKMG) components, mixed threshold voltage (MVT) components and so on.

In view of the above, the present disclosure indeed can overcome the headroom and breakdown voltage issues together by coupling HV components and LV components.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An input buffer, comprising:

a current mirror circuit, comprising:

a first transistor configured to be coupled with a current source at a first node; and a second transistor coupled with the first transistor, and configured to output, according to a first current flowing through the first transistor, a second current at a second node; and a first amplifier coupled with the current mirror circuit at the second node, and comprising a first transistor pair, wherein a first breakdown voltage of the first transistor is smaller than a second breakdown voltage of the second transistor, wherein the first transistor pair is configured to generate a first voltage and a second voltage in response to the second current, a first input voltage, and a second input voltage, wherein body terminals of each transistor of the first transistor pair are coupled to the second node.

2. The input buffer of claim 1, wherein each transistor of the first transistor pair and the first to second transistors are P-type transistors.

3. The input buffer of claim 1, wherein the first to second transistors are P-type transistors, and each transistor of the first transistor pair is an N-type transistor.

4. The input buffer of claim 1, wherein a first terminal and a control terminal of the first transistor are coupled with each other at the first node.

5. The input buffer of claim 1, wherein a control terminal of the first transistor and a control terminal of the second transistor are coupled with each other at the first node.

6. The input buffer of claim 5, wherein a third breakdown voltage of the first transistor is larger than the first breakdown voltage.

7. The input buffer of claim 1, wherein the first transistor pair comprises:

a third transistor and a fourth transistor that are coupled with each other in parallel between the second node and a ground terminal.

8. The input buffer of claim 7, wherein the first amplifier further comprises:

a first resistor coupled with the third transistor in series; and a second resistor coupled with the fourth transistor in series.

9. The input buffer of claim 8, wherein the first resistor and the second resistor have a same resistance value.

10. The input buffer of claim 1, wherein the second input voltage oscillates with respect to a central value and the first input voltage is equal to the central value.

11. The input buffer of claim 1, further comprising:

a second amplifier, comprising:

a second transistor pair having control terminals coupled with the first amplifier, wherein the second amplifier is configured to generate an output voltage, in response to the first voltage and the second voltage.

12. A method for operating an input buffer, comprising:

inputting a supply voltage at a first node where first and second transistors of a current mirror circuit are coupled with each other;

generating, by a current source, a first current flowing through the first transistor;

outputting, by the second transistor, in response to the supply voltage and the first current, a second current, to generate a first voltage at a second node between the current mirror circuit and a first amplifier;

generating, in response to the first voltage and a reference voltage received at a gate terminal of a third transistor, a third current flowing through a first path, and generating, in response to the first voltage and an oscillating input signal received at a gate terminal of a fourth transistor, a fourth current flowing through a second path, wherein the first path and the second path are in parallel in the first amplifier and between the second node and a ground terminal, wherein the gate terminal of the third transistor is separated from the gate terminal of the fourth transistor; and generating a second voltage and a third voltage according to the third current and the fourth current.

13. The method of claim 12, wherein the supply voltage is 2.2 to 2.5 volts.

14. The method of claim 12, wherein the method further comprises:

generating, by a second amplifier, at least one fourth voltage in response to the second voltage and the third voltage.

* * * * *